(12) United States Patent
Jeong et al.

(10) Patent No.: US 11,586,313 B2
(45) Date of Patent: Feb. 21, 2023

(54) DISPLAY DEVICE

(71) Applicant: Samsung Display Co., LTD., Yongin-si (KR)

(72) Inventors: Jin Ho Jeong, Seoul (KR); Myoung-Ho Kwon, Busan (KR); Ho Seok Son, Seoul (KR); Jin Bo Shim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/549,132

(22) Filed: Dec. 13, 2021

(65) Prior Publication Data
US 2022/0107699 A1  Apr. 7, 2022

Related U.S. Application Data

(63) Continuation of application No. 17/021,516, filed on Sep. 15, 2020, now Pat. No. 11,199,922.

(30) Foreign Application Priority Data

Jan. 14, 2020  (KR) .................. 10-2020-0004984

(51) Int. Cl.
*G06F 3/041* (2006.01)
*G06F 3/044* (2006.01)

(52) U.S. Cl.
CPC .......... *G06F 3/0412* (2013.01); *G06F 3/0445* (2019.05); *G06F 3/0446* (2019.05); *G06F 2203/04112* (2013.01)

(58) Field of Classification Search
CPC combination set(s) only.
See application file for complete search history.

(56) References Cited

U.S. PATENT DOCUMENTS

| | | | | |
|---|---|---|---|---|
| 2017/0185193 | A1* | 6/2017 | Kim | G02F 1/134363 |
| 2020/0218391 | A1* | 7/2020 | Kamiya | H01L 51/5253 |
| 2022/0013594 | A1* | 1/2022 | Wang | H01L 51/5228 |

FOREIGN PATENT DOCUMENTS

| | | |
|---|---|---|
| KR | 10-2018-0074880 | 7/2018 |
| KR | 10-2018-0083459 | 7/2018 |
| KR | 10-2018-0116851 | 10/2018 |
| KR | 10-2019-0047536 | 5/2019 |
| KR | 10-2019-0081756 | 7/2019 |
| KR | 10-2023436 | 9/2019 |

* cited by examiner

*Primary Examiner* — Sanjiv D. Patel
(74) *Attorney, Agent, or Firm* — Kile Park Reed & Houtteman PLLC

(57) ABSTRACT

A display device includes a first display area including a first pixel area; a second display area including a second pixel area and a transmissive area; a signal line, a common electrode, and a touch electrode that are disposed in the second display area. The common electrode includes an opening overlapping the transmissive area, and the common electrode is disposed between the signal line and the touch electrode to overlap the signal line.

17 Claims, 13 Drawing Sheets

DISPLAY DEVICE

CROSS-REFERENCE TO RELATED APPLICATION(S)

This is a continuation application of U.S. patent application Ser. No. 17/021,516, filed Sep. 15, 2020 (now pending), the disclosure of which is incorporated herein by reference in its entirety. U.S. patent application Ser. No. 17/021,516 claims priority to and benefit of Korean Patent Application No. 10-2020-0004984 under 35 U.S.C. § 119, filed on Jan. 14, 2020 in the Korean Intellectual Property Office, the entire contents of which are incorporated herein by reference.

BACKGROUND

1. Technical Field

This disclosure relates to a display device, and to a display device including a touch sensor.

2. Description of the Related Art

A display device such as an emissive display device may include a display panel that may provide a screen on which an image may be displayed. The display device may include a touch sensor, and a touch electrode of the touch sensor may be provided or disposed on the display panel. The display panel may be a touch screen panel.

The display device may include an optical device such as a sensor or a camera. The optical device may be disposed in a bezel region (for example, a region surrounding the screen) of the display device to avoid interference with the screen.

By reducing the bezel of the display device, it may be possible to increase a screen-to-body ratio of the display device, for example, a ratio of the screen to the display device in a case that the display device may be viewed from a front thereof. The screen-to-body ratio reflects a technical level of the display device, and at the same time, it is an important factor that a consumer considers when selecting a product. However, as the size of the bezel of the display device is reduced, it may be difficult to dispose an optical device in the bezel region.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

It is conceivable to dispose an optical device in a bezel region, but not within the screen, for example, to overlap the screen. To this end, a display panel providing a screen of a display device may include a region having high transmittance. In order to increase the transmittance, it may be possible to partially remove a layer or a constituent element that may lower the transmittance. In this case, signals transferred through signal lines of the display panel may affect the touch sensor, which may deteriorate the sensitivity of the touch sensor.

Embodiments improve performance of a touch sensor while disposing an optical device in a screen in a display device including a touch sensor and an optical device.

A display device according to an embodiment may include a first display area including a first pixel area; a second display area including a second pixel area and a transmissive area; and a signal line, a common electrode, and a touch electrode that may be disposed in the second display area. The common electrode may include an opening overlapping the transmissive area, and the common electrode may be disposed between the signal line and the touch electrode to overlap the signal line.

The signal line may be a data line that may transfer a data signal, and the touch electrode may include an opening overlapping a pixel disposed in the second pixel area and may have a mesh form.

The second pixel area may be provided in plural, the transmissive area may be provided in plural, the common electrode may include a first portion disposed at a boundary of transmissive areas which may be adjacent to each other in a first direction, and the first portion of the common electrode may overlap the data line.

The touch electrode may include a plurality of touch electrode sections disposed in the plurality of second pixel areas, and the plurality of touch electrode sections may be electrically connected to each other.

The plurality of touch electrode sections may include touch electrode sections which may be adjacent to each other in a second direction and may be electrically connected to each other by a connection line overlapping the first portion of the common electrode.

The signal line may be a gate line transferring a gate signal. The touch electrode may include an opening overlapping a pixel disposed in the second pixel area and may have a mesh form.

The second pixel area may be provided in plural, the transmissive area may be provided in plural, the common electrode may include a second portion disposed at a boundary of transmissive areas which may be adjacent to each other in a second direction, and the second portion of the common electrode may overlap the gate line.

The touch electrode may include a plurality of touch electrode sections which may be disposed in the plurality of second pixel areas, and the plurality of touch electrode sections may include touch electrode sections that may be adjacent to each other in a first direction and may be electrically connected to each other by a connection line overlapping the second portion of the common electrode.

A pixel density of the second display area may be smaller than a pixel density of the first display area.

At least one pixel electrode may be disposed in the second pixel area, and no pixel electrode may be disposed in the transmissive area.

The touch electrode may be disposed in the second pixel area and may not overlap the opening of the common electrode.

The display device may further include an optical device overlapping the second display area.

A display device according to an embodiment may include a display panel including a first display area including a first pixel area and a second display area including a second pixel area and a transmissive area. The display panel may include in the second display area a first insulating layer; a gate line disposed on the first insulating layer; a second insulating layer disposed on the gate line; a data line disposed on the second insulating layer; a third insulating layer disposed on the data line; a pixel electrode disposed on the third insulating layer; a conductive layer disposed on the third insulating layer and including an opening overlapping the pixel electrode; a common electrode disposed on the fourth insulating layer, overlapping the data line, and including an opening overlapping the transmissive area; an encapsulation layer disposed on the common electrode; and a touch electrode disposed on the encapsulation layer.

The common electrode may extend along a side surface of the fourth insulating layer in the transmissive area.

At least one of the third insulating layer and the fourth insulating layer may include an opening overlapping the opening of the common electrode in the transmissive area.

The second pixel may be provided in plural, the transmissive may be provided in plural, the common electrode may include a portion disposed at a boundary of transmissive areas which may be adjacent to each other in a first direction, and the portion of the common electrode may overlap the data line.

The touch electrode may include a plurality of touch electrode sections disposed in the plurality of second pixel areas, and the plurality of touch electrode sections may be electrically connected to each other.

The plurality of touch electrode sections may include touch electrode sections which may be adjacent to each other in a second direction and may be electrically connected to each other by a connection line overlapping the portion of the common electrode.

The pixel electrode may be disposed in the second pixel area and may not be disposed in the transmissive area.

The touch electrode may be disposed in the second pixel area and may not overlap the opening of the common electrode.

According to the embodiments, in a display device including a touch sensor and an optical device, the transmittance of the display area corresponding to the optical device may be increased, and performance of the touch sensor may be improved by shielding noise that may be introduced into the touch sensor. In addition, although not specifically mentioned, according to embodiments, there are advantageous effects that can be recognized throughout the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
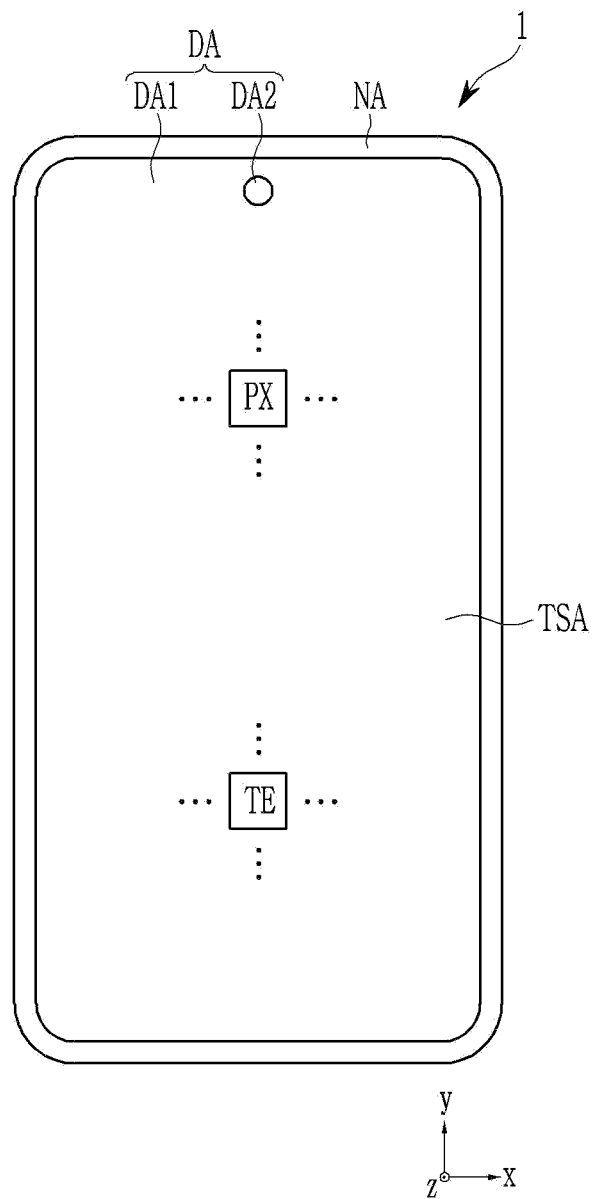
FIG. 1 illustrates a schematic top plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the symbols x, y, and z are used to indicate directions, where the symbol x indicates a first direction, y indicates a second direction that may be perpendicular to the first direction, and z indicates a third direction that may be perpendicular to the first direction and the second direction.

Figure 2:
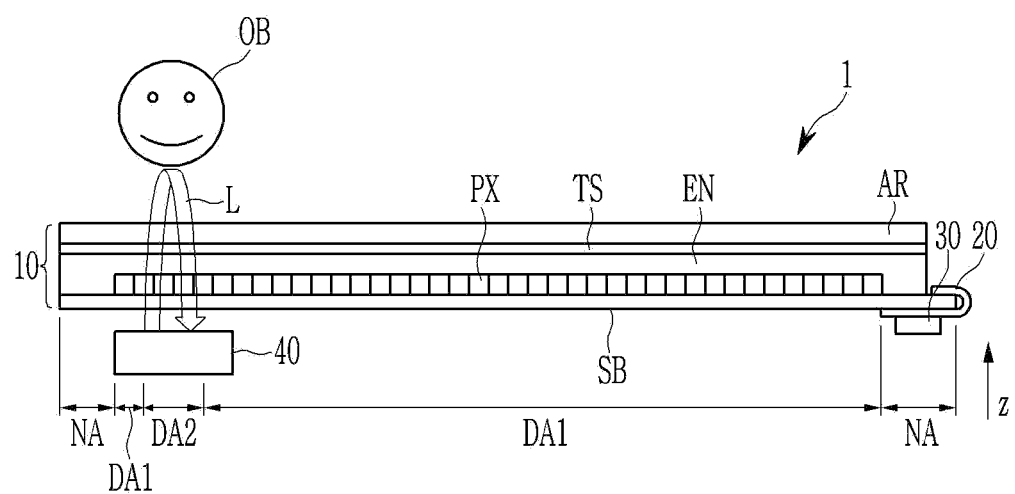
FIG. 2 illustrates a schematic cross-sectional view of a display device according to an embodiment.

FIG. 1 illustrates a schematic top plan view of a display device 1 according to an embodiment, and FIG. 2 illustrates a schematic cross-sectional view of the display device 1 according to an embodiment.

Referring to FIG. 1 and FIG. 2, the display device 1 may include a display panel 10, a flexible printed circuit film 20 electrically connected to the display panel 10, a driving unit including an integrated circuit chip 30 and the like, and an optical device 40.

The display panel 10 may display an image and sense a touch. The display device 10 may include a display area DA that may display an image, and a non-display area NA that may surround or be adjacent to the display area DA to not display an image therein. The display area DA may correspond to a screen.

Pixels PX may be arranged or disposed in a matrix form in the display area DA. One pixel PX is a minimum unit that may form a screen, for example, a minimum unit that may display an image, and each pixel PX may display a specific or predetermined color, for example, any one of red, green, and blue colors at various luminance levels, according to an input image signal. Circuits and/or wires that may generate and/or transfer various signals applied to the display area may be disposed in the non-display area. Each of the pixels PX may be electrically connected with a signal line such as a gate line, a data line, and a driving voltage line to receive a gate signal, a data voltage, a driving voltage, and the like within the spirit and the scope of the disclosure.

The display area DA may include a first display area DA1 and a second display area DA2. The second display area DA2 may have a higher transmittance than the first display area DA1 to be able to perform other functions in addition to a sole function of displaying an image. Herein, the transmittance indicates transmittance of light that transmits through the display panel 10 in a third direction z. The light may be visible light and/or light having a wavelength other than visible light (for example, infrared light). The second display area DA2 may have a lower density of pixels PX, in other words, a lower number of pixels PX per unit area, than the first display area DA1.

The second display area DA2 may be variously positioned or disposed in the display area DA. In the illustrated embodiment, the second display area DA2 may be positioned or disposed within the first display area DA1 to be surrounded by the first display area DA1. The second display area DA2 may be positioned or disposed to be in contact with the non-display area NA. The second display area DA2 may be positioned or disposed at a left side, a right side, and/or a center from an upper end of the display area DA. The second display area DA2 may be separated into two or more areas. The second display area DA2 may be positioned or disposed across the upper end of the display area DA along a first direction x. The second display area DA2 may be positioned or disposed across a left end and/or a right end of the display area DA along a second direction y. The second display area DA2 may have various shapes such as a quadrangle, a triangle, a polygon, a circle, an ellipse, and so on within the spirit and the scope of the disclosure.

The driving unit may be disposed in the non-display area NA of the display panel 10 to generate and/or process various signals that may drive the display panel 10. The driving unit may include a data driver that may apply a data voltage to the data line, a gate driver that may apply a gate signal to the gate line, a signal controller that may control the data driver and the gate driver, and the like within the spirit and the scope of the disclosure. The gate driver may be integrated in the display panel 10, and may be disposed at left and right sides of the display area DA or at one side thereof. The data driver and the signal controller may be provided as an integrated circuit chip (also referred to as a driving IC chip) 30, and the integrated circuit chip 30 may be mounted on the flexible printed circuit film 20 to be electrically connected to the display panel 10. The integrated circuit chip 30 may be mounted in the non-display area NA of the display panel 10.

A touch sensing area TSA that may sense a touch may approximately coincide with the display area DA. Touch electrodes TE may be arranged or disposed in the touch sensing area TSA. One touch electrode TE may extend over the pixels PX. The touch electrodes TE may sense a user's contact or non-contact touch. Each of the touch electrodes TE may sense a touch by using a self-capacitance method, or adjacent touch electrodes TE may sense a touch by using a mutual capacitance method. The display panel 10 may be referred to as a touch screen panel. The display device 1 may include a touch driver that may generate signals that may drive the touch electrodes TE and processing signals received from the touch electrodes TE, and the touch driver may be provided as an integrated circuit chip.

The display panel 10 may include a substrate SB, and the pixels PX may be disposed on the substrate SB. The substrate SB may be continuously positioned over the first display area DA1 and the second display area DA2. The display panel 10 may include an encapsulation layer EN entirely covering or overlapping the pixels PX. The encapsulation layer EN may seal the first display area DA1 and the second display area DA2 to prevent water or oxygen from penetrating into the display panel 10.

A touch sensor layer TS in which the touch electrodes TE may be arranged or disposed may be positioned or disposed on the encapsulation layer EN. The touch electrode TE may be formed by using a metal mesh. The touch electrode TE may be formed by using a transparent conductive material such as indium tin oxide (ITO) or indium zinc oxide (IZO). The touch electrode TE may be formed to include a single layer or multiple layers.

An anti-reflection layer AR that may reduce external light reflection may be disposed on the encapsulation layer EN, and the anti-reflection layer AR may include a polarization layer and/or a retardation layer or retarder.

The optical device 40 may be disposed on a rear surface of the display panel 10 to overlap the display panel 10. The optical device 40 may include a camera, a sensor, a flash, or the like within the spirit and the scope of the disclosure. In a case that the optical device 40 may include a sensor, the optical device 40 may include a proximity sensor or an illuminance sensor. Light of a wavelength used by the optical device 40 may pass through the display panel 10 with a higher transmittance through the second display area DA2. Various electronic devices may be disposed on the rear surface of the display panel 10 in addition to the optical device 40.

The optical device 40 may emit light L with a predetermined wavelength range toward an object OB disposed on a front surface of the display panel 10 or may receive the light L reflected from the object OB. The light L of the predetermined wavelength range may be light having a wavelength that may be processed by the optical device 40, and may be visible light and/or infrared light. Light of a specific wavelength may mainly pass through a transmissive area positioned in the second display area DA2. In a case that the optical device 40 uses infrared light, the light of the predetermined wavelength may have a wavelength range of about 900 nm to about 1000 nm. The optical device 40 may receive the light of the predetermined wavelength to be irradiated onto the front surface of the display device 10. The optical device 40 may be disposed to correspond to the entire second display area DA2, or may be disposed to correspond to a part of the second display area DA2. Optical devices 40 may be disposed in the second display area DA2.

The first display area DA1 and the second display area DA2 of the display device 1 according to an embodiment will be described with reference to FIG. 3 and FIG. 4.

Figure 3:
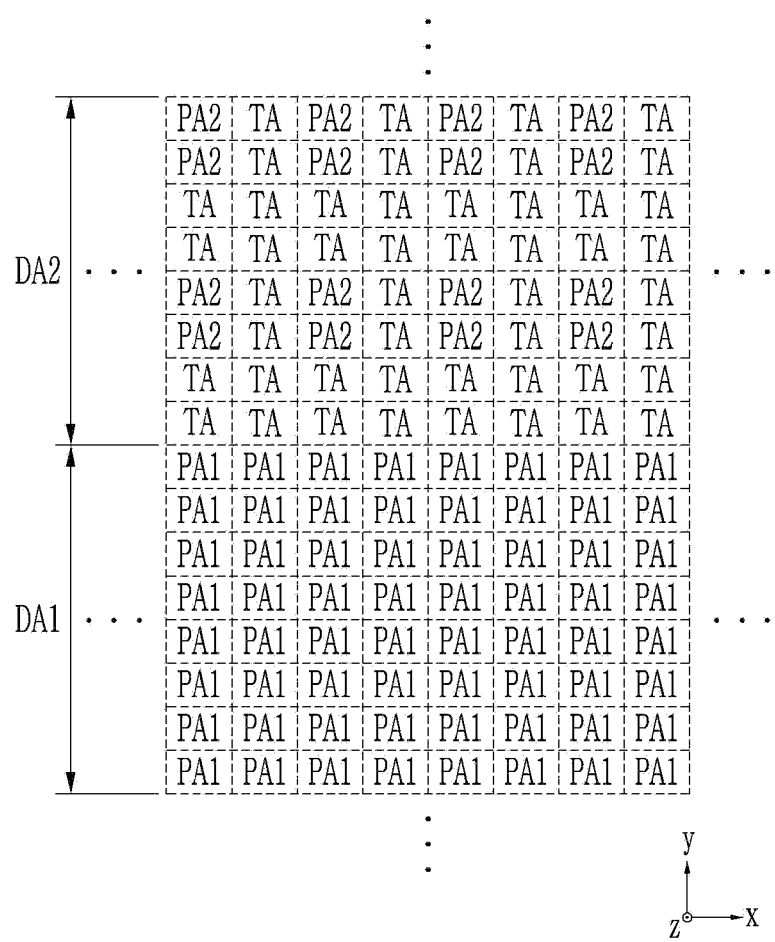
FIG. 3 and FIG. 4 illustrate schematic layout views of a first display area and a second display area of a display device according to an embodiment.
Figure 4:
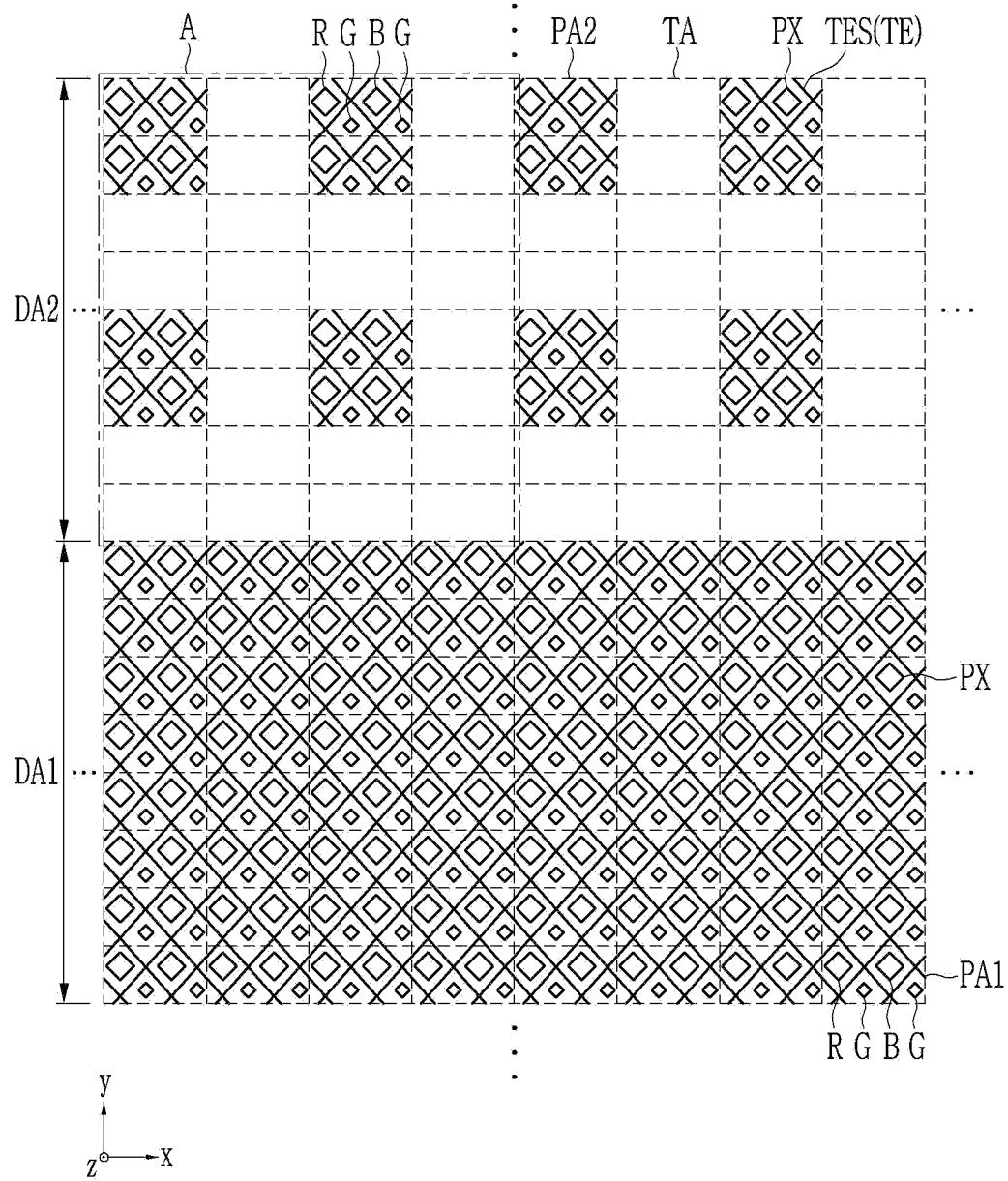

FIG. 3 and FIG. 4 illustrate schematic layout views of the first display area DA1 and the second display area DA2 of the display device 1 according to an embodiment. FIG. 3 illustrates a schematic disposal of the first and second pixel areas PA1 and PA2 and a transmissive areas TA, and FIG. 4 illustrates the pixels PX that may be included in the first and second pixel areas PA1 and PA2 and the transmissive area TA.

Referring to FIG. 3, the first display area DA1 may include first pixel areas PA1, and the second display area DA2 may include second pixel areas PA2 and transmissive areas TA. A size of one first pixel area PA1 and a size of one second pixel area PA2 may be substantially the same or different.

In the first display area DA1, the first pixel areas PA1 may be arranged or disposed in a matrix form in the first direction x and the second direction y. In the second display area DA2, the second pixel areas PA2 and the transmissive areas TA may be arranged or disposed in a matrix form. One or more second pixel areas PA2 and one or more transmissive areas TA may be alternately arranged or disposed in the first direction x and/or the second direction y. The second pixel areas PA2 and the transmissive areas TA may be arranged or disposed in a checkerboard pattern so that the second pixel areas PA2 and the transmissive areas TA may be uniformly mixed. In the illustrated embodiment, two second pixel areas PA2 may be surrounded by the transmissive areas TA. As an example, the transmissive areas TA may be arranged or disposed to surround one second pixel area PA2.

A size of one second pixel area PA1 and a size of one transmissive area TA may be substantially the same or different. Respective transmissive areas TA may have substantially the same size or may be different from each other. A disposal and size of the second pixel areas PA2 and the transmissive areas TA may be variously changed. For example, in the illustrated embodiment, for the transmissive area TA, an area ratio of the second pixel area PA2 to the transmissive area TA in the second display area DA2 may be approximately 1:3, but it may have various area ratios such as 1:1, 1:7, and 1:15. For example, the area ratio of the second pixel area PA2 to the transmissive area TA may be about 1:2(n−1) (where n is a natural number). A pixel density and transmittance of the second display area DA2 may be changed according to the area ratio of the second pixel area PA2 to the transmissive area TA. The pixel density and transmittance may have a trade-off relationship.

The first pixel area PA1 and the second pixel area PA2 may each include one or more pixels PX. The pixel PX may include a pixel circuit and a light emitting portion. The pixel circuit, which may be a circuit that may drive a light emitting element such as a light emitting diode (LED), may include a transistor, a capacitor, and the like within the spirit and the scope of the disclosure. The light emitting portion may be a region in which light emitted from a light emitting element may be outputted. The pixel PX illustrated in FIG. 4 may correspond to the light emitting portion. The light emitting portion may have a substantially rhombus shape, but may have various shapes such as a rectangle and a circle. The pixels PX may emit light in one direction, for example, in the third direction z. A touch electrode section TES may be positioned in the first pixel area PA1 and the second pixel area PA2. The touch electrode section TES may be formed by using a metal mesh in which metal wires may be entangled like a net, and the metal mesh may be positioned or disposed to not cover or overlap the light emitting portion. Touch electrode sections TES may be electrically connected to each other to form one touch electrode TE.

The transmissive area TA may not include a pixel circuit and a light emitting portion. The touch electrode TE may not be or may almost not be disposed in the transmissive area TA. The touch electrode TE may not overlap an opening OPN of a common electrode E2. Since the pixel circuit, the light emitting portion, the touch electrode TE, and the like, which may interfere with the transmission of light, are not or are almost not disposed in the transmissive area TA, the transmittance may be higher than the first and second pixel areas PA1 and PA2. Different from what is illustrated, the touch electrode TE in the second display area DA2 may be continuously positioned or disposed over the second pixel area PA2 and the transmissive area TA.

In an embodiment illustrated in FIG. 4, each of the first pixel areas PA1 may include one red pixel R, two green pixels G, and one blue pixel B. Each of the second pixel areas PA2 may include one red pixel R, two green pixels G, and one blue pixel B. Different from what is illustrated, a pixel disposal of the first pixel area PA1 may be different from that of the second pixel area PA2. In a case that a set of pixels R, G, and B included in each of the first and second pixel areas PA1 and PA2 is referred to as a unit pixel, a configuration of the unit pixel of the first pixel area PA1 and the configuration of the unit pixel of the second pixel area PA2 may be substantially the same or different. The unit pixel may include one red pixel R, one green pixel G, and one blue pixel B. The unit pixel may include at least one of the red pixel R, the green pixel G, and the blue pixel B, and may also include a white pixel.

The pixels R, G, and B included in the first display area DA1 may constitute a pixel row in the first direction x. The pixels R, G, and B included in the second display area DA2 may also constitute a pixel row in the first direction x.

In each pixel row in the first display area DA1, pixels R, G, and B may be arranged or disposed substantially in a row in the first direction x. In each pixel row, the pixels R, G, and B may be repeatedly arranged or disposed in an order of the red pixel R, the green pixel G, the blue pixel B, and the green pixel G in the first direction x. A disposal of the pixels R, G, and B included in one pixel row may be changed in various ways. For example, the pixels R, G, and B may be repeatedly arranged or disposed in an order of the blue pixel B, the green pixel G, the red pixel R, and the green pixel G in the first direction x, or may be repeatedly arranged or disposed in an order of the red pixel R, the blue pixel B, the green pixel G, and the blue pixel B.

In each pixel row in the second display area DA2, the pixels R, G, and B may be arranged or disposed substantially in a row in the first direction x. In each pixel row, the pixels R, G, and B may be repeatedly arranged or disposed in an order of the red pixel R, the green pixel G, the blue pixel B, and the green pixel G in the first direction x. A disposal of the pixels R, G, and B included in one pixel row may be changed in various ways.

The pixels R, G, and B of the first and second pixel areas PA1 and PA2 may also constitute a pixel column in the second direction y. In each pixel column, the pixels R, G, and B may be substantially arranged or disposed in a line in the second direction y. Pixels PX of the same color may be arranged or disposed in each pixel column, and pixels PX of two or more colors may be alternately arranged or disposed in the second direction y. A disposal of the pixels R, G, and B included in one pixel column may be changed in various ways.

The pixels R, G, and B of the second pixel area PA2 may be of a single-sided emission type, for example, a front emission type emitting light in the third direction z. The pixels R, G, and B of the second pixel area PA2 may be of a rear emission type or a double-sided emission type.

Figure 5:
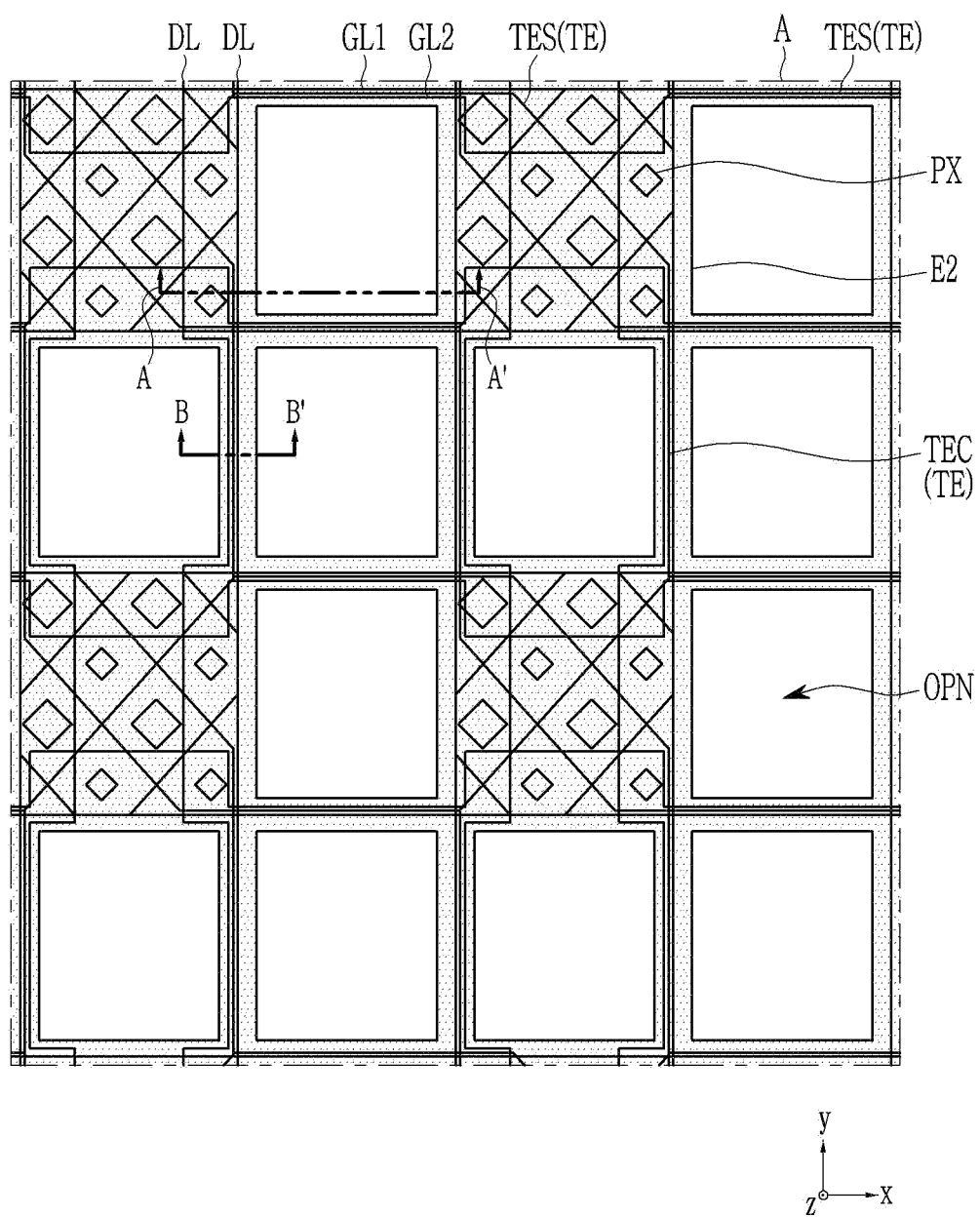
FIG. 5 illustrates a schematic enlarged view of a region A in FIG. 4.
Figure 6:
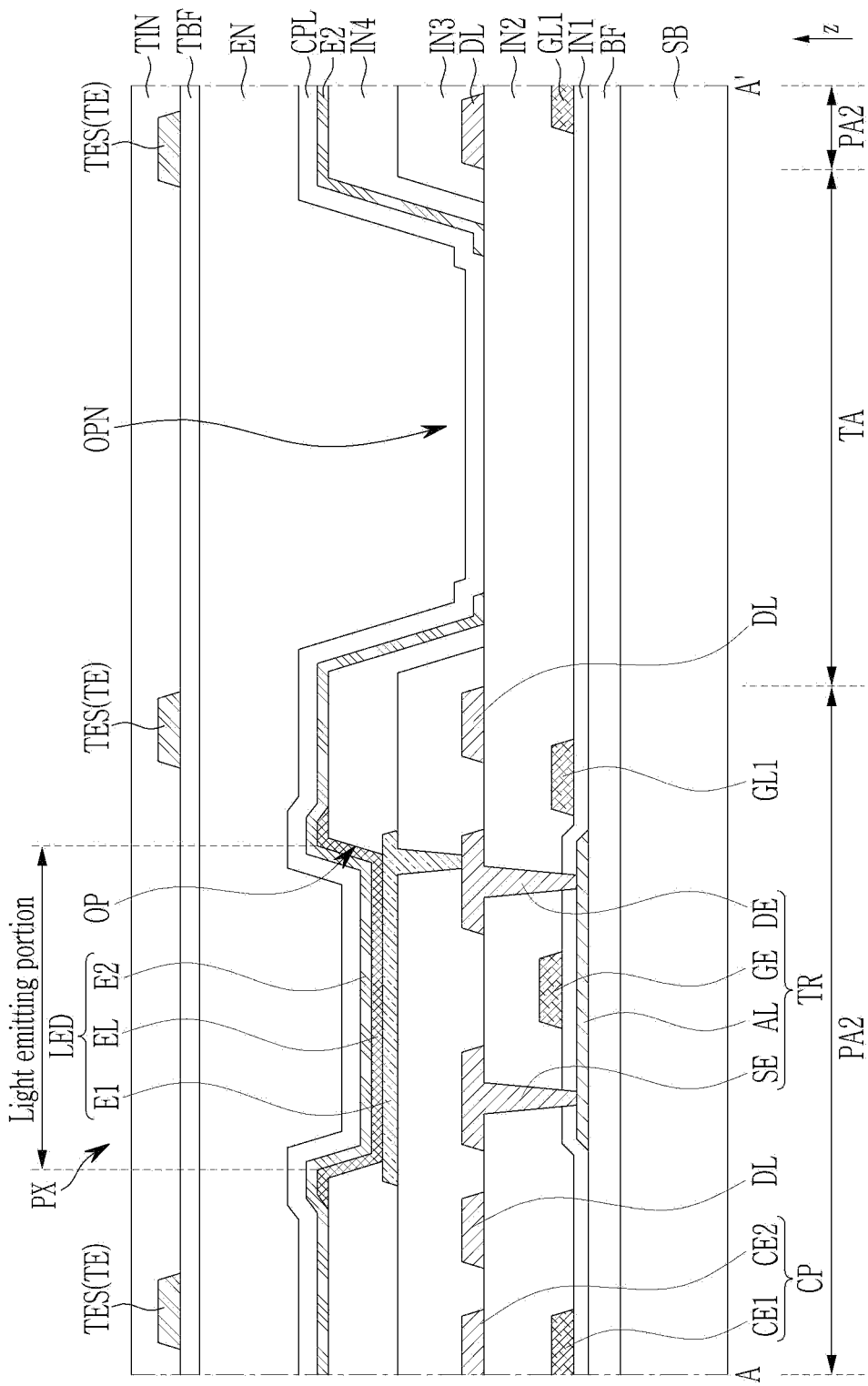
FIG. 6 illustrates a schematic cross-sectional view taken along a line A-A' of FIG. 5.
Figure 7:
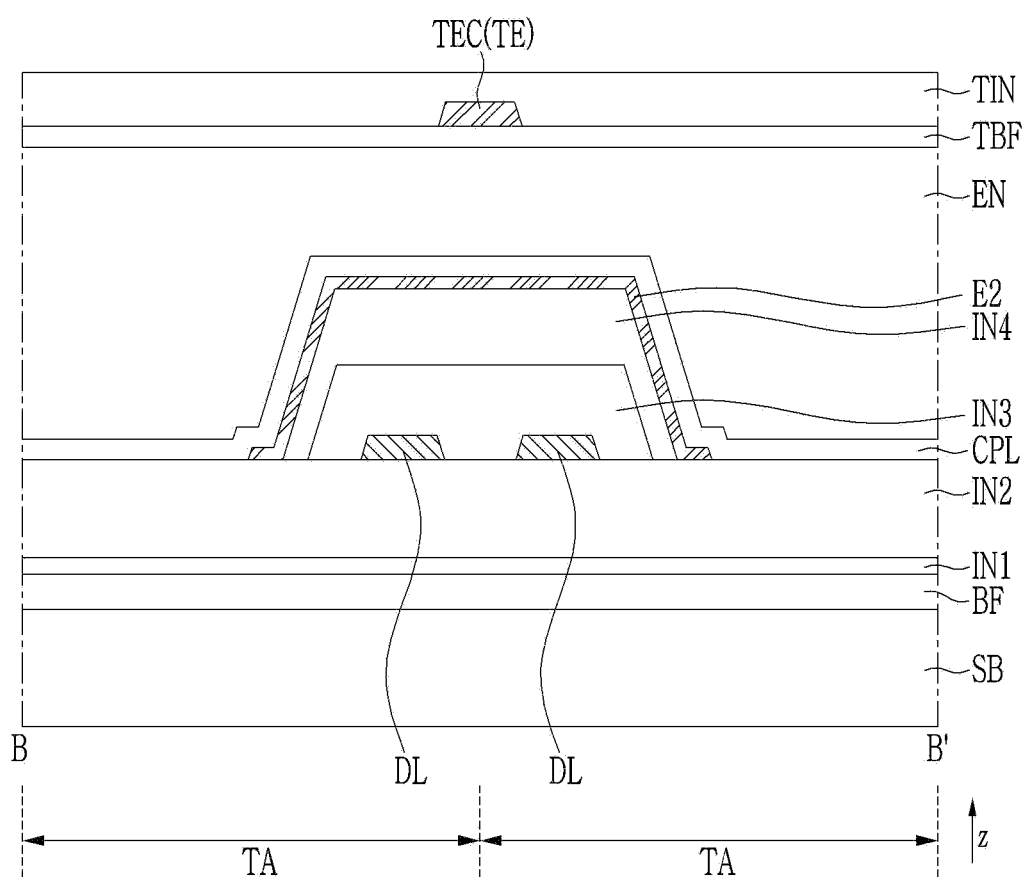
FIG. 7 illustrates a schematic cross-sectional view taken along a line B-B' of FIG. 5.

FIG. 5 illustrates a schematic enlarged view of a region A in FIG. 4, FIG. 6 illustrates a schematic cross-sectional view taken along a line A-A' of FIG. 5, and FIG. 7 illustrates a schematic cross-sectional view taken along a line B-B' of FIG. 5. FIG. 5 illustrates substantially eight second pixel areas PA2 and 24 transmissive areas TA in the second display area DA2. FIG. 6 schematically illustrates one transistor TR and one capacitor CP among constituent elements of a pixel circuit PC positioned or disposed in the second pixel area PA2.

Referring to FIG. 5, in the second display area DA2, the second pixel area PA2 and the transmissive area TA may be adjacent, and the second pixel area PA2 may include the pixels R, G, and B. The gate lines GL1 and GL2 transferring gate signals to the pixels R, G, and B may extend substantially in the first direction x, and the data line DL transferring data signals may extend substantially in the second direction y. One data line DL may be provided to each pixel column. Each data line DL may extend over the first display area DA1 and the second display area DA2. Two or more gate lines GL1 and GL2 may be provided to each pixel row to transfer gate-on voltages having different timings. Different from that as illustrated, data lines DL may be provided or disposed in each pixel column, or one data line DL may be provided or disposed in pixel columns.

The gate lines GL1 and GL2 and the data line DL may substantially extend through boundaries of the adjacent transmissive areas TA such that the transmittance of the transmissive area TA may not be lowered by the gate lines GL1 and GL2. In the illustrated embodiment, one of the two adjacent data lines DL may include a portion extending in the first direction x near a boundary between the second pixel area PA2 and the transmissive area TA, and one of the two adjacent gate lines GL1 and GL2 may include a portion extending in the second direction y near a boundary between the second pixel area PA2 and the transmissive area TA. The gate lines GL1 and GL2 and the data lines DL may substantially extend through the boundary between the second pixel area PA2 and the transmissive area TA, or extend through the second pixel area PA2.

Referring to FIG. 5, FIG. 6, and FIG. 7, the display device may include a substrate SB and various layers, wires, and elements formed or disposed thereon. The elements may include a transistor TR, a capacitor CP, and a light emitting diode (LED).

The substrate SB may include a polymer such as a polyimide or a polyamide, or an insulating material such as glass, and may be optically transparent. In a case that the substrate SB may include a polymer layer, the substrate SB may include a barrier layer including an inorganic insulating material such as a silicon oxide ($SiO_x$) or a silicon nitride ($SiN_x$) to prevent penetration of moisture or the like within the spirit and the scope of the disclosure.

A buffer layer BF may be positioned or disposed on the substrate SB to prevent diffusion of impurities that deteriorate properties of an active layer AL and to prevent penetration of moisture or the like within the spirit and the scope of the disclosure.

The active layer AL of the transistor TR may be disposed on the buffer layer BF. The active layer AL may include a channel region and source and drain regions at opposite sides of the channel region. The active layer AL may include a semiconductor material such as polysilicon, amorphous silicon, and/or an oxide semiconductor.

A first insulating layer IN1, which may include an inorganic insulating material, may be disposed on the active layer AL. The first insulating layer IN1 may be disposed over an entire surface of the substrate SB, and may also be disposed in the transmissive area TA.

A first conductive layer, which may include a gate electrode GE of the transistor TR, a first electrode CE1 of the capacitor CP, and the gate lines GL1 and GL2, may be disposed on the first insulating layer IN1. The gate electrode GE may overlap the channel region of the active layer AL.

The first conductive layer may include a metal such as molybdenum (Mo), copper (Cu), aluminum (Al), silver (Ag), chromium (Cr), tantalum (Ta), or titanium (Ti).

A second insulating layer IN2, which may include an inorganic insulating material, may be disposed on the first conductive layer. A second conductive layer, which may include a source electrode SE and a drain electrode DE of the transistor TR, a second electrode CE2 of the capacitor CP, a data line DL, a driving voltage line, and the like, may be positioned or disposed on the second insulating layer IN2. The source electrode SE and the drain electrode DE may be respectively electrically connected to the source region and the drain region of the active layer AL through openings of the second insulating layer IN2. The second conductive layer may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta).

The gate electrode GE, the source electrode SE, and the drain electrode DE may constitute the transistor TR together with the active layer AL. The first electrode CE1 and the second electrode CE2 may constitute the capacitor CP together with the second insulating layer IN2 therebetween. The transistor TR and the capacitor CP constituting the pixel circuit may not be disposed in the transmissive area TA.

A third insulating layer IN3, which may include an organic insulating material, may be disposed on the second insulating layer IN2 and the second conductive layer. The third insulating layer IN3 may serve to eliminate steps and perform planarization to increase luminous efficiency of the light emitting diode display to be formed thereon. The third insulating layer IN3 may be disposed to cover or overlap the second insulating layer IN2 and the second conductive layer in the second pixel area PA2. The third insulating layer IN3 may cover or overlap the transistor TR.

The third insulating layer IN3 may be at least partially removed in the transmissive area TA to improve transmittance. For example, it may not be disposed in the transmissive area TA except for the vicinity of the boundary between the transmissive area TA and the second pixel area PA2 and the boundary of the adjacent transmissive areas TA.

A pixel electrode E1 may be disposed on the third insulating layer IN3. The pixel electrode E1 may be a first electrode of two electrodes of the light emitting diode LED of the pixel PX. The pixel electrode E1 may be electrically connected to the drain electrode DE of the transistor TR through an opening of the third insulating layer IN3. The pixel electrode E1 may be individually provided for each pixel PX. The pixel electrode E1 may include a metal such as silver (Ag), lithium (Li), calcium (Ca), aluminum (Al), magnesium (Mg), and gold (Au), and indium tin oxide (ITO), and may also include a transparent conductive oxide (TCO) such as indium zinc oxide (IZO).

A fourth insulating layer IN4, which may include an organic insulating material, may be disposed on the third insulating layer IN3 and the pixel electrode E1. The fourth insulating layer IN4 may have an opening OP overlapping the pixel electrode E1. The opening OP may define an area corresponding to the light emitting portion of the pixel PX. The fourth insulating layer IN4 may cover or overlap an edge of the pixel electrode E1. The third insulating layer IN3 and the fourth insulating layer IN4 may be at least partially removed in the transmissive area TA to improve transmittance.

Different from that as illustrated, at least one of the third insulating layer IN3 and the fourth insulating layer IN4 may not be removed in the transmissive area TA, but may be disposed to cover or overlap the entire substrate SB. At least one of the buffer layer BF, the first insulating layer IN1, and the second insulating layer IN2 may be at least partially removed in the transmissive area TA to improve the transmittance of the transmissive area TA.

An emission layer EL may be disposed on the pixel electrode E1. The emission layer EL may include material layers that may uniquely or individually emit light of primary colors such as red, green, and blue. The emission layer EL may have a structure in which material layers emitting different colors of light may be stacked.

A common electrode E2 may be disposed on the emission layer EL. The common electrode E2 may be a second electrode of the two electrodes of the light emitting diode LED. In FIG. 5, a shaded area corresponds to an area where the common electrode E2 may be disposed. In the second display area DA2, the common electrode E2 may be positioned or disposed to cover or overlap each second pixel area PA2. The common electrode E2 may be at least partially removed in the transmissive area TA to improve transmittance. For example, the common electrode E2 may include an opening OPN overlapping the transmissive area TA. The common electrode E2 may be disposed to overlap the data line DL near the boundary between the second pixel area PA2 and the transmissive area TA which may be adjacent to each other in the first direction x. The common electrode E2 may be disposed to overlap the gate lines GL1 and GL2 near the boundary between the second pixel area PA2 and the transmissive area TA which may be adjacent to each other in the second direction y. The common electrode E2 may be disposed to overlap the data line DL in the vicinity of the boundary of the transmissive areas TA which may be adjacent in the first direction x. The common electrode E2 may be disposed to overlap the gate lines GL1 and GL2 near the boundary of the transmissive areas TA which may be adjacent in the second direction y.

As described above, the common electrode E2 may be disposed above the data lines DL and the gate lines GL1 and GL2 to overlap them to prevent or reduce an effect of the touch electrode TE by the data signal and the gate signal transmitted through the data lines DL and the gate lines GL1 and GL2. The common electrode E2 may extend along a side surface of the fourth insulating layer IN4 to an edge of the transmissive area TA to sufficiently shield the data line DL. The common electrode E2 may surround or be adjacent to a top surface and at least one side surface of the data line DL.

The common electrode E2 in the first display area DA1 may be disposed to entirely cover or overlap the first pixel areas PA1. Accordingly, the common electrode E2 may be disposed to cover or overlap an area excluding the transmissive area TA in the display area DA. The common electrode E2 may be provided in common to all the pixels PX, and may receive a common voltage ELVSS. The common electrode E2 may include a transparent conductive oxide (TCO) such as an indium tin oxide (ITO) or an indium zinc oxide (IZO).

A capping layer CPL may be disposed on the common electrode E2. The capping layer CPL may improve light efficiency by adjusting a refractive index. The capping layer CPL may be disposed to entirely cover or overlap the common electrode E2. The capping layer CPL may include an organic insulating material or an inorganic insulating material.

In the first pixel area PA1 and the second pixel area PA2, the pixel electrode E1, the emission layer EL, and the common electrode E2 may constitute a light emitting element that may be a light emitting diode LED. The pixel electrode E1 may be an anode which may be a hole injection electrode, and the common electrode E2 may be a cathode which may be an electron injection electrode. Conversely, the pixel electrode E1 may be a cathode, and the common electrode E2 may be an anode. In the light emitting diode LED, the pixel electrode E1 may be reflective, the common electrode E2 may be transmissive, and light emitted by the light emitting diode LED may be outputted to the front side, for example, in the third direction z.

An encapsulation layer EN may be disposed on the capping layer CPL. The encapsulation layer EN may be a thin film encapsulation layer in which at least one inorganic layer and/or at least one organic layer may be stacked on the capping layer CPL.

A buffer layer TBF, which may include an inorganic insulating material such as a silicon nitride or a silicon oxide, may be disposed on the encapsulation layer EN.

A touch electrode TE may be disposed on the buffer layer TBF. The touch electrode TE may include a metal such as aluminum (Al), copper (Cu), titanium (Ti), molybdenum (Mo), silver (Ag), chromium (Cr), or nickel (Ni). The touch electrode TE may have a mesh shape having an opening overlapping the light emitting portion. The touch electrode TE may include a conductive nanomaterial such as a silver nanowire and a carbon nanotube. The touch electrode TE may include a transparent conductive material such as ITO and TZO.

The touch electrode TE may be electrically connected to the touch driver through wires disposed on a same layer or a different layer from the touch electrode TE. The touch electrodes TE which may be adjacent to each other in the first direction x or the second direction y may be electrically connected through a bridge disposed on a same layer or a different layer from the touch electrode TE. The touch electrode sections TES which may be adjacent to each other in the first direction x and/or the second direction y may be electrically connected by a connection line TEC in the second display area DA2. The touch electrode sections TES and the connection lines TEC may constitute the touch electrode TE.

The common electrode E2 of the light emitting diode LED may be disposed between the touch electrode TE and the data line DL to overlap them in the third direction z. Accordingly, the common electrode E2 may shield noise that may be introduced into the touch electrode TE from the data line DL and/or the gate lines GL1 and GL2. Thus, it may be possible to prevent the touch electrode TE from being influenced by a data signal and/or a gate signal that may drive the light emitting diode, and it may be possible to solve the problem that the touch sensitivity may be lowered.

As the common electrode E2 overlaps the touch electrode TE, capacity of the capacitor formed by the touch electrode TE and the common electrode E2 may increase. Since base capacitance of the touch electrode TE may be increased, in a case that the touch electrode TE may be used as a touch capacitor electrode of a magnetic capacitor type, touch sensitivity may be improved.

An insulating layer TIN may be disposed on the touch electrode TE to protect the touch electrode TE.

Meanwhile, a schematic cross-sectional structure of the first pixel area PA1 of the first display area DA1 may correspond to a schematic cross-sectional structure of the second pixel area PA2.

Hereinafter, differences from the above-described embodiment will be mainly described.

Figure 8:
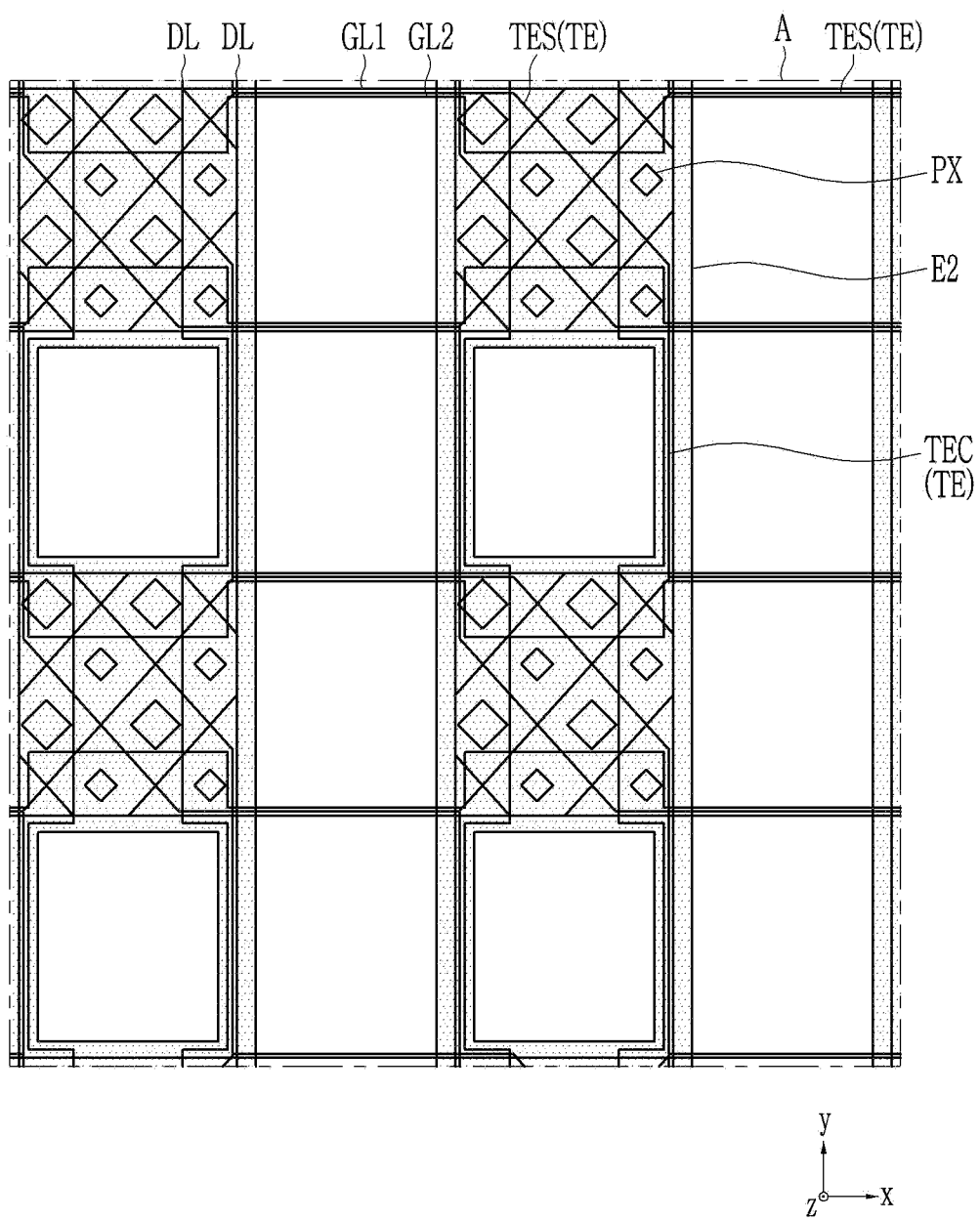
FIG. 8 schematically illustrates a top plan view of a region corresponding to the region A of FIG. 4 in a display device according to an embodiment.
Figure 9:
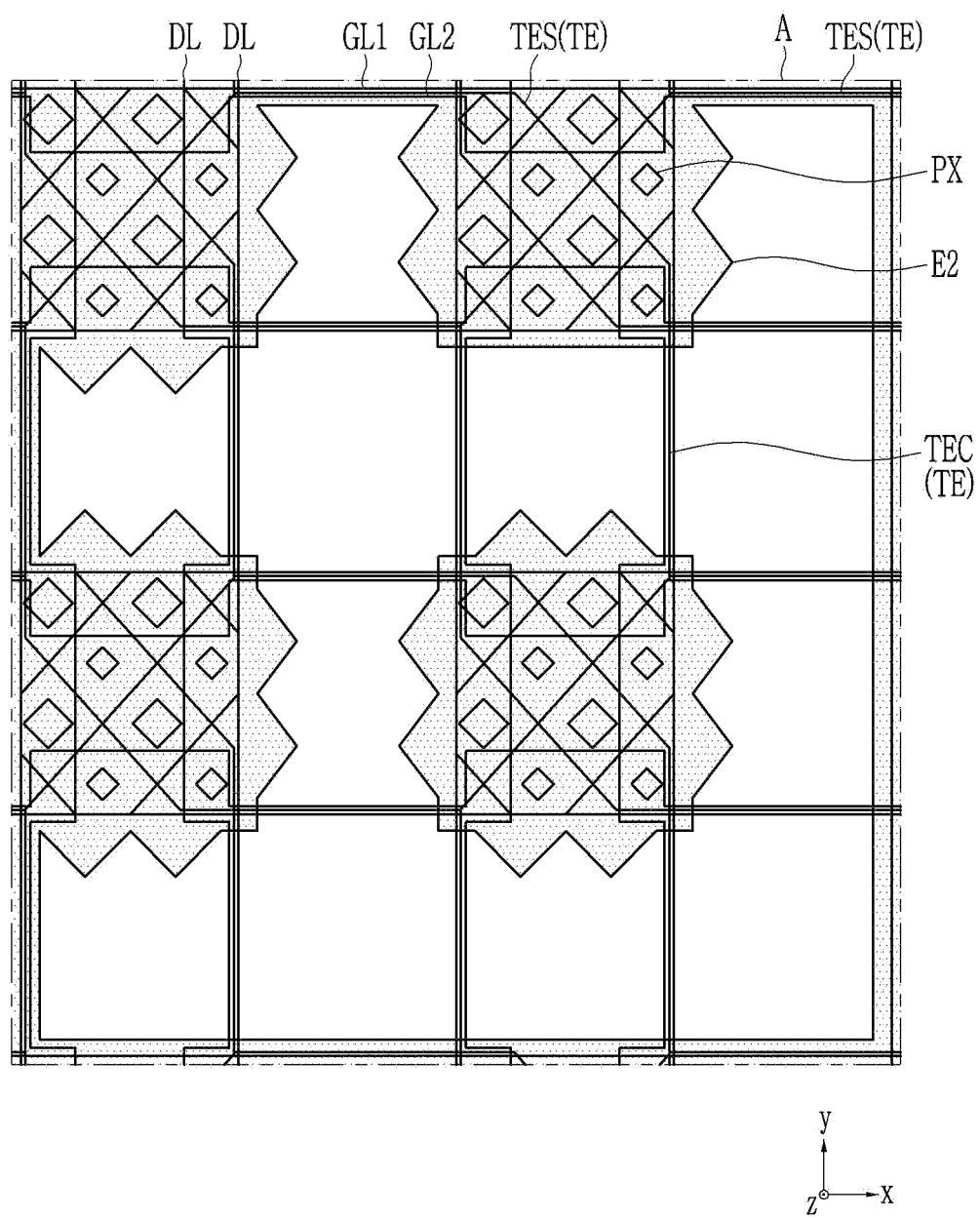
FIG. 9 schematically illustrates a top plan view of a region corresponding to the region A of FIG. 4 in a display device according to an embodiment.

FIG. 8 and FIG. 9 schematically illustrate top plan views of a region corresponding to the region A of FIG. 4 in a display device according to an embodiment.

The embodiment of FIG. 8 may be different from the embodiment of FIG. 5 in a region of the common electrode E2 of the light emitting diode. Referring to FIG. 8, the common electrode E2 may not be disposed between the transmissive areas TA which may be adjacent to each other in the second direction y.

The gate signal applied through gate lines GL1 and GL2 and the data signal applied through data lines DL may not be constant and they may fluctuate. Therefore, if the touch electrode TE is not shielded from the gate lines GL1 and GL2 and/or the data lines DL, a voltage of the touch electrode TE may be affected by variations in the gate signal and/or the data signal. Since the gate lines GL1 and GL2 may be at a greater distance from the touch electrode TE than the data line DL (see FIG. 6), the effect of the gate lines GL1 and GL2 on the touch electrode TE may be less than the effect of the data line DL on the touch electrode TE. Accordingly, the common electrode E2 may be removed near the boundary of the transmissive areas TA in which the gate lines GL1 and GL2 may extend in the first direction x to further increase the transmittance of the transmissive area TA.

In this way, a region where the common electrode E2 may be formed may be reduced, or vice versa. As illustrated in FIG. 9, a region of the common electrode E2 may be variously changed.

Figure 10:
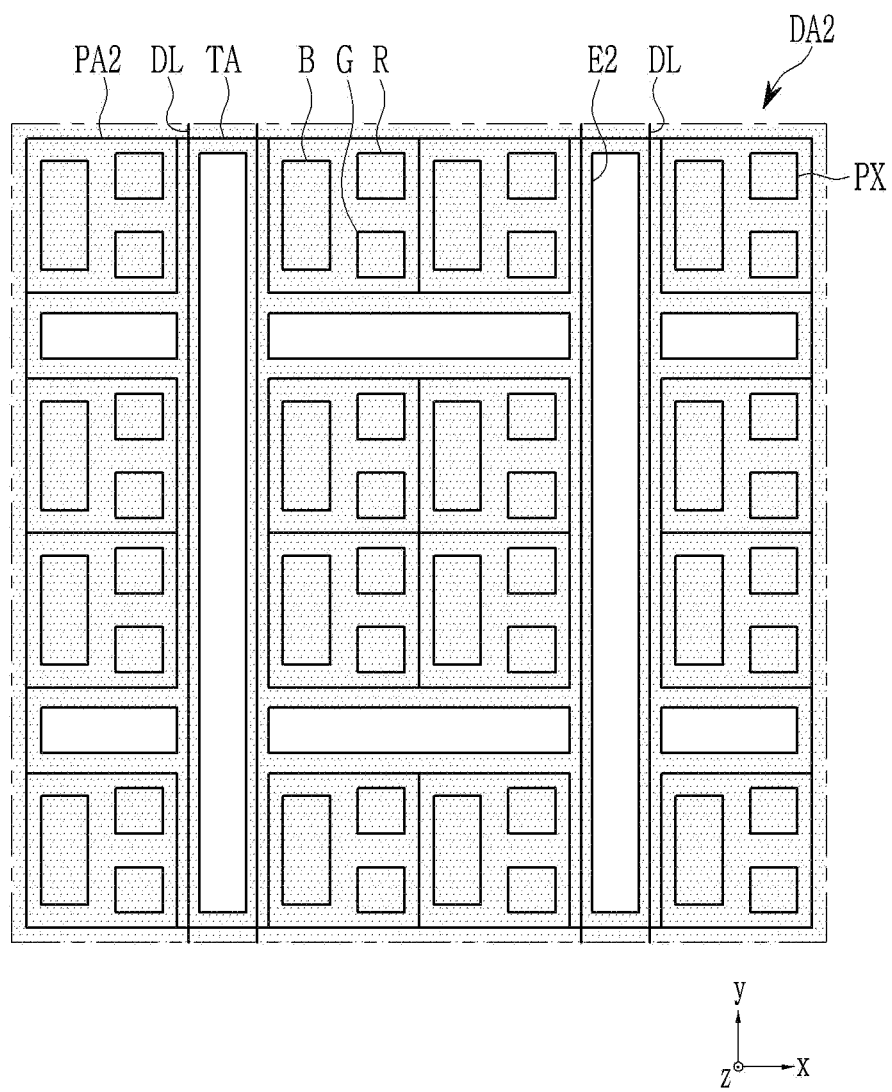
FIG. 10 illustrates a schematic layout view of a second display area of a display device according to an embodiment.

FIG. 10 illustrates a schematic layout view of the second display area DA2 in a display device according to an embodiment. FIG. 10 schematically illustrates the pixel PX, the common electrode E2 of the light emitting diode, and the data line DL in the second pixel area PA2 and the transmissive area TA.

Referring to FIG. 10, an area ratio of the second pixel area PA2 to the transmissive area TA may be approximately 16:9, and the pixel PX may have a substantially rectangular shape. The second pixel area PA2 may include one blue pixel B, one red pixel R, and one green pixel G, and may have other unit pixel configurations. The common electrode E2 may be disposed to overlap the data line DL in the boundary between the second pixel area PA2 and the transmissive area TA which may be adjacent to each other in the first direction x. Accordingly, the common electrode E2 may minimize an effect of noise of the data line DL on the touch electrode TE.

In addition to the illustrated embodiment, a ratio and disposal of the second pixel area PA2 and the transmissive area TA and a pixel structure may be variously changed in the second display area DA2. The common electrode E2 may be formed or disposed to overlap the data line DL, and the data line DL may be disposed to overlap the common electrode E2 in order to prevent the sensitivity of the touch electrode TE from deteriorating in the second display area DA2 having the transmissive area TA regardless of such a ratio, disposal, and structure.

A pixel circuit that may be included in the pixels PX of the first pixel area PA1 and the second pixel area PA2 will be described as an equivalent circuit diagram.

Figure 11:
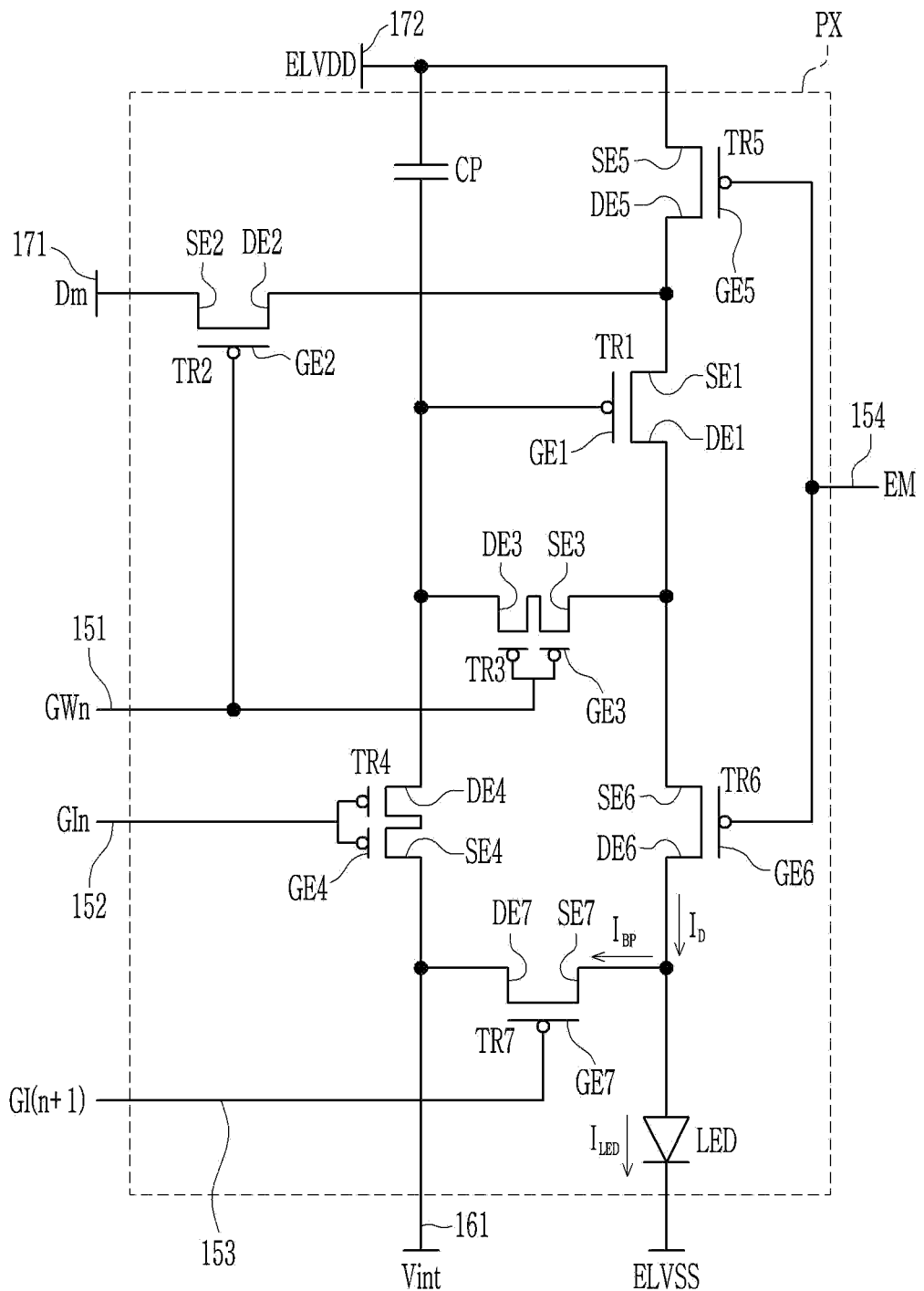
FIG. 11 illustrates an equivalent circuit diagram of a pixel of a display device according to an embodiment.

FIG. 11 illustrates an equivalent circuit diagram of one pixel PX of a display device according to an embodiment.

Referring to FIG. 11, one pixel PX may include transistors TR1, TR2, TR3, TR4, TR5, TR6, and TR7, a capacitor CP, and a light emitting diode LED that may be electrically connected to signal lines 151, 152, 153, 154, 161, 171, and 172.

The signal lines 151, 152, 153, 154, 161, 171, and 172 may include gate lines 151, 152, and 153, a light emission control line 154, a data line 171, a driving voltage line 172, and an initialization voltage line 161. The gate lines 151, 152, and 153 may correspond to the gate lines GL1 and GL2 described above, and the data line 171 may correspond to the data line DL described above.

The gate lines 151, 152, and 153 may transfer gate signals GWn, GIn, and GI(n+1), respectively. The gate signals GWn, GIn, and GI(n+1) may transfer a gate-on voltage and a gate-off voltage that may respectively turn the transistors TR2, TR3, TR4, and TR7 included in the pixel PX on and off.

The gate lines 151, 152, and 153 electrically connected to the pixel PX may include a first gate line 151 through which the gate signal GWn may be transferred, a second gate line 152 through which the gate signal GIn having a gate-on voltage may be transferred at a different time from that of the first gate line 151, and a third gate line 153 through which the gate signal GI(n+1) may be transferred. The second gate line 152 may transfer the gate-on voltage at a time that may be earlier than that of the first gate line 151. For example, in a case that the gate signal GWn is an $n^{th}$ gate signal among the gate signals applied during one frame, the gate signal GIn may be a previous-stage gate signal such as an $(n-1)^{th}$ gate signal, and the gate signal GI(n+1) may be an $n^{th}$ gate signal. The gate signal GI(n+1) may be a different gate signal from the $n^{th}$ gate signal.

The light emission control line 154 may transmit a light emission control signal EM to be able to control light emission of the light emitting diode LED. The emission control signal EM may include a gate-on voltage and a gate-off voltage.

The data line 171 may transfer a data signal Dm. The driving voltage line 172 may transfer a driving voltage ELVDD. The data signal Dm may have a different voltage level depending on an image signal inputted into the display device, and the driving voltage ELVDD may have a substantially constant level. The initialization voltage line 161 may transfer a constant voltage such as an initialization voltage Vint.

The display device may include a driving device (for example, a gate driver, a data driver, a signal controller, within the spirit and the scope of the disclosure) that may generate signals transferred to the signal lines 151, 152, 153, 154, 161, 171, and 172.

The transistors TR1, TR2, TR3, TR4, TR5, TR6, and TR7 included in one pixel PX may include a first transistor TR1, a second transistor TR2, a third transistor TR3, a fourth transistor TR4, a fifth transistor TR5, a sixth transistor TR6, and a seventh transistor TR7.

The first gate line 151 may transfer the gate signal GWn to the second transistor TR2 and the third transistor TR3. The second gate line 152 may transfer the gate signal GIn to the fourth transistor TR4. The third gate line 153 may transfer the gate signal GI(n+1) to the seventh transistor TR7. The light emission control line 154 may transfer the light emission control signal EM to the fifth transistor TR5 and the sixth transistor TR6. Respective transistors TR1, TR2, TR3, TR4, TR5, TR6, and TR7 may include source electrodes SE1, SE2, SE3, SE4, SE5, SE6, and SE7, drain electrodes DE1, DE2, DE3, DE4, DE5, DE6, and DE7, and gate electrodes GE1, GE2, GE3, GE4, GE5, GE6, and GE7, and may be electrically connected as illustrated.

The first transistor TR1 may receive the data signal Dm transferred by the data line 171 depending on a switching operation of the second transistor TR2 to supply a current LED to the light emitting diode LED.

The second transistor TR2 may be turned on depending on the scan signal GWn received through the first gate line 151 to transfer the data signal Dm transferred from the data line 171 to the source electrode SE1 of the first transistor TR1.

The third transistor TR3 may be turned on depending on the gate signal GWn transferred through the first gate line 151 to electrically connect the gate electrode GE1 and the drain electrode DE1 of the first transistor TR1 to each other such that the first transistor TR1 may be diode-connected.

The fourth transistor TR4 is turned on in response to the gate signal GIn received through the second gate line 152 to transfer the initialization voltage Vint to the gate electrode GE1 of the first transistor TR1, in order to perform an initializing operation that may initialize a voltage of the gate electrode GE1 of the transistor TR1.

The fifth transistor TR5 and the sixth transistor TR6 may be simultaneously turned on depending on the light emission control signal EM transferred through the light emission control line 154, thereby the driving voltage ELVDD may be compensated through the diode-connected first transistor TR1 to be transmitted to the light emitting diode LED.

A first end of the capacitor CP may be electrically connected to the gate electrode GE1 of the first transistor TR1, and a second end thereof may be electrically connected to the driving voltage line 172. A cathode of the light emitting diode LED may be electrically connected to the terminal of the common voltage ELVSS that may transfer the common voltage ELVSS to receive the common voltage ELVSS.

A number of transistors and a number of capacitors that may be included in one pixel PX and a connection relationship thereof may be variously modified.

An operation of the display device according to an embodiment will be briefly described as follows. When the gate signal GIn of the gate-on voltage level may be supplied through the second gate line 152 during an initialization period (the gate signal GIn may be an $(n-1)^{th}$ gate signal), the fourth transistor TR4 may be turned on, the initialization voltage Vint may be transferred to the gate electrode GE1 of the first transistor TR1 through the fourth transistor TR4, and the first transistor TR1 may be initialized by the initialization voltage Vint.

Subsequently, when the gate signal GWn of the gate-on voltage level may be supplied through the first gate line 151 during a data programming and compensation period (the scan signal GWn may be an $n^{th}$ scan signal), the second transistor TR2 and the third transistor TR3 may be turned on. The first transistor TR1 may be diode-connected by the turned-on third transistor TR3 and may be biased in a forward direction. Accordingly, a compensation voltage that may be decreased by a threshold voltage of the first transistor TR1 from the data signal Dm supplied through the data line 171 may be applied to the gate electrode GE1 of the first transistor TR1. The driving voltage ELVDD and the compensation voltage may be respectively applied to opposite terminals of the capacitor CP, and the capacitor CP may be charged with a charge corresponding to a voltage difference of the opposite terminals.

When the emission control signal EM supplied from the emission control line 154 is changed from the gate-off voltage level to the gate-on voltage level during the light emission period, the fifth transistor TR5 and the sixth transistor TR6 may be turned on, the driving current ID corresponding to a voltage difference between a gate voltage of the gate electrode GE1 of the first transistor TR1 and the driving voltage ELVDD may be generated, and the driving current ID may be supplied to the light emitting diode LED through the sixth transistor TR6, thus a current ILED may flow through the light emitting diode LED.

On the other hand, during an initialization period, the seventh transistor TR7 receives the gate signal GI(n+1) of the gate-on voltage level through the third gate line 153 to be turned on. The gate signal GI(n+1) may be the $n^{th}$ gate signal. Some or a predetermined amount of the driving current ID may flow out through the turned-on seventh transistor TR7 as a bypass current IBP.

Figure 12:
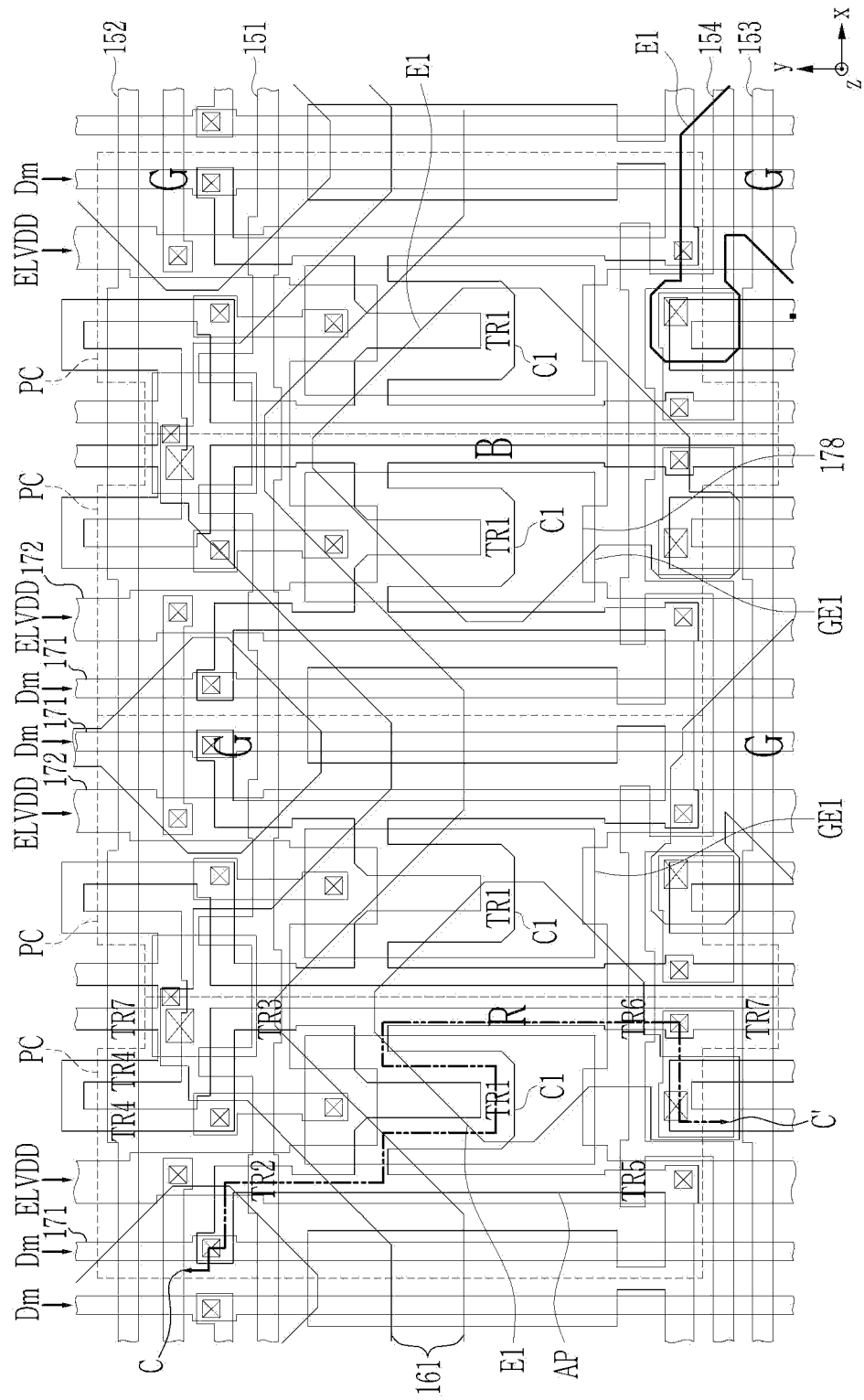
FIG. 12 illustrates a layout view of a display area of a display device according to an embodiment.
Figure 13:
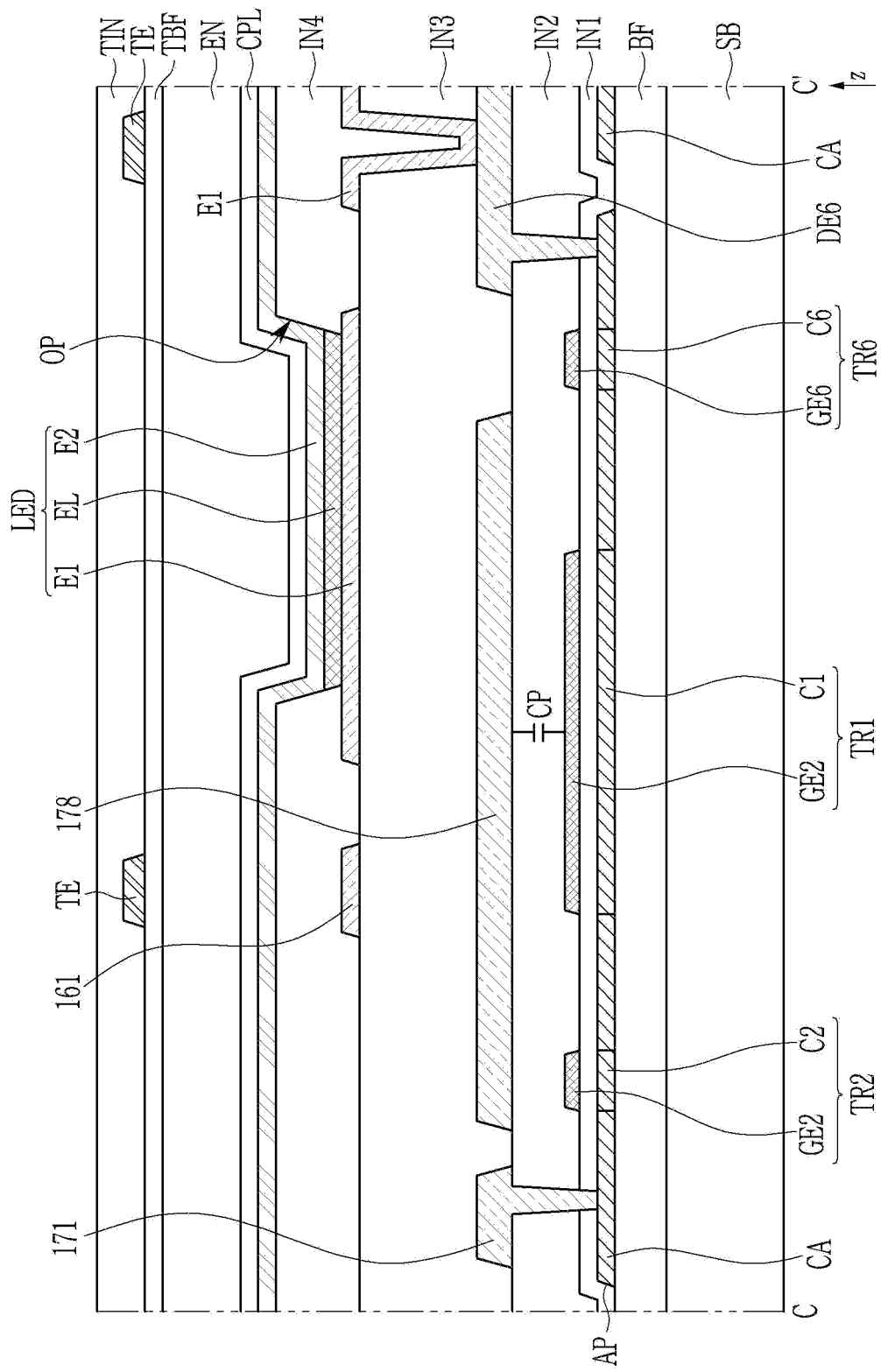
FIG. 13 illustrates a schematic cross-sectional view taken along line C-C' of FIG. 12 according to an embodiment.

FIG. 12 illustrates a layout view of the display area DA of a display device according to an embodiment, and FIG. 13 illustrates a schematic cross-sectional view taken along line C-C' of FIG. 12 according to an embodiment. The illustrated layout may be an example of the first pixel area PA1 and/or the second pixel area PA2.

Referring to FIG. 12, the display device according to the embodiment may include pixel circuits PC corresponding to the pixels R, G, and B. The pixel circuits PC may be arranged or disposed in a matrix form.

The pixel circuit PC may include the transistors TR1, TR2, TR3, TR4, TR5, TR6, and TR7 electrically connected with the gate lines 151, 152, and 153, the light emission control line 154, the data line 171, the driving voltage line 172, and the initialization voltage line 161. The gate lines 151, 152, and 153 and the light emission control line 154 may extend substantially in the first direction x, and the data line 171, the driving voltage line 172, and the initialization voltage line 161 may extend substantially in the second direction y. The driving voltage line 172 and/or the initialization voltage line 161 may have a substantially mesh form. The driving voltage line 172 may include an extension 178.

A channel of each of the transistors TR1, TR2, TR3, TR4, TR5, TR6, and TR7 may be formed inside an active pattern AP. The active pattern AP may be substantially curved in various shapes. For example, the first transistor TR1 may include a channel region C1 of the active pattern AP that may be bent at least once. The first transistor TR1 of the second pixel area PA2 may drive the pixel PX of the second pixel area PA2 to display higher luminance than the pixel PX of the first pixel area PA1. Accordingly, the first transistor TR1 disposed in the second pixel area PA2 may have a larger channel region C1 than the first transistor TR1 disposed in the first pixel area PA1.

Referring to FIGS. 12 and 13, the display device according to an embodiment may include a substrate SB, and a buffer layer BF, which may be an insulating layer, may be disposed on the substrate SB.

The active pattern AP may be positioned on the buffer layer BF. The active pattern AP may include channel regions C1, C2, and C6 and a conductive area CA. The conductive area CA may be disposed at opposite sides of the respective channel regions C1, C2, and C6, and may be source and drain regions of the corresponding transistors.

The first insulating layer IN1 may be disposed on the active pattern AP, and a first conductive layer which may include the gate lines 151, 152, and 153, the light emission control line 154, the gate electrodes GE1, GE2, and GE6, and the like may be disposed on the first insulating layer IN1.

The second insulating layer IN2 may be disposed on the first conductive layer. A second conductive layer, which may include the data line 171, the driving voltage line 172, and the drain electrode DE6, may be disposed on the second insulating layer IN2. The data line 171 may be electrically connected to a source region of the second transistor TR2 through openings of the first and second insulating layers IN1 and IN2. The extension 178 of the driving voltage line 172 may overlap the gate electrode GE1 of the first transistor TR1 with the second insulating layer IN2 therebetween to constitute the capacitor CP. The drain electrode DE6 may be electrically connected to a drain region of the sixth transistor TR6 through the openings of the first and second insulating layers IN1 and IN2.

A third insulating layer IN3 may be disposed on the second conductive layer. A third conductive layer, which may include the pixel electrode E1 of the pixels R, G, and B, an initialization voltage line 161, and the like, may be disposed on the third insulating layer IN3. The pixel electrode E1 may be electrically connected to the drain electrode DE6 through an opening of the third insulating layer IN3. The third conductive layer may be reflective or transflective.

A fourth insulating layer IN4 may be disposed on the third conductive layer. The fourth insulating layer IN4 may have an opening OP overlapping the pixel electrode E1. An emission layer EL disposed at least in the opening OP may be disposed on the pixel electrode E1. A common electrode E2 may be disposed on the emission layer EL and the fourth insulating layer IN4. The common electrode E2 may be transparent. The common electrode E2 may be disposed over the entire first display area DA1. The common electrode E2 may not be substantially disposed in the transmissive area TA, but may be disposed at an edge of the transmissive area TA to shield the touch electrode TE from the signal lines such as the data line 171 and the gate lines 151, 152, and 153 as described above in order to increase the transmittance of the transmissive area TA in the second display area DA2.

The pixel electrode E1, the emission layer EL, and the common electrode E2 of each pixel R, G, and B may constitute a light emitting diode LED as a light emitting element. The pixel electrode E1 may be an anode which may be a hole injection electrode, and the common electrode E2 may be a cathode which may be an electron injection electrode.

A capping layer CPL may be disposed on the common electrode E2, and the encapsulation layer EN may be disposed on the capping layer CPL.

A buffer layer TBF, which may include an inorganic insulating material such as a silicon nitride or a silicon oxide, may be disposed on the encapsulation layer EN. A touch electrode TE may be disposed on the buffer layer TBF, and an insulating layer TIN may be disposed on the touch electrode TE. The touch electrode TE may have a substantially mesh shape having openings overlapping the pixels PX.

The first display area DA1 described above may have the structure illustrated in FIG. 12 and FIG. 13. The second pixel area PA2 of the second display area DA2 may have a substantially same or similar structure. The pixel circuit PC that may drive the light emitting diode LED may not be or may almost not be disposed in the transmissive area TA of the second display area DA2. For example, the transistors TR1, TR2, TR3, TR3, TR4, TR5, TR5, and TR7 and the capacitor CP may not be disposed the transmissive area TA. At least a portion of each of the signal lines 151, 152, 153, 154, 161, 171, and 172 may not be positioned or disposed in the transmissive area TA. Accordingly, the transmittance of the transmissive area TA may be higher than that of the first and second pixel areas PA1 and PA2.

While the disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a first display area including a first pixel area;
a second display area including a second pixel area and a transmissive area;
a pixel disposed in the second pixel area and including a light emitting portion;
a signal line disposed in the second pixel area and electrically connected to the pixel;
a touch electrode disposed around the light emitting portion in the second pixel area and overlapping the signal line; and
a common electrode disposed in the second display area, wherein
the touch electrode overlaps the common electrode,
the second pixel area is provided in plural, and
the transmissive area is provided in plural,
the common electrode includes a first portion disposed at a boundary of transmissive areas which are adjacent to each other in a first direction, and
the first portion overlaps the signal line.

2. The display device of claim 1, wherein
the touch electrode overlaps the signal line and the common electrode overlaps the signal line.

3. The display device of claim 1, wherein
the common electrode is disposed between the signal line and the touch electrode.

4. The display device of claim 1, wherein
the common electrode includes an opening overlapping the transmissive area.

5. The display device of claim 1, wherein
the common electrode includes a second portion disposed at a boundary of transmissive areas which are adjacent to each other in a second direction, and
the second portion overlaps the signal line.

6. The display device of claim 1, wherein
the touch electrode includes a plurality of touch electrode sections disposed in the plurality of second pixel areas, and
the plurality of touch electrode sections is electrically connected to each other.

7. The display device of claim 1, wherein
the touch electrode includes an opening overlapping the pixel and has a mesh form.

8. The display device of claim 1, wherein
the signal line is a data line transferring a data signal or a gate line transferring a gate signal.

9. The display device of claim 1, wherein
a pixel density of the second display area is smaller than a pixel density of the first display area.

10. The display device of claim 1, wherein
at least one pixel electrode is disposed in the second pixel area, and
no pixel electrode is disposed in the transmissive area.

11. A display device comprising:
a display panel configured to display images and sense touches; and
a camera overlapping the display panel,
wherein the display panel comprises:
a first display area including a first pixel area;
a second display area including a second pixel area and a transmissive area;
a pixel disposed in the second pixel area and including a light emitting portion;

a signal line disposed in the second pixel area and electrically connected to the pixel; and a touch electrode disposed around the light emitting portion in the second pixel area and overlapping the signal line, wherein the display panel further comprises a common electrode disposed in the second display area, and the touch electrode overlaps the common electrode.

12. The display device of claim 11, wherein the camera overlaps the second display area.

13. The display device of claim 11, wherein the touch electrode overlaps the signal line, the common electrode overlaps the signal line, and the common electrode is disposed between the signal line and the touch electrode.

14. The display device of claim 11, wherein the common electrode includes an opening overlapping the transmissive area.

15. The display device of claim 11, wherein the second pixel area is provided in plural, the transmissive area is provided in plural, the common electrode includes a first portion disposed at a boundary of transmissive areas which are adjacent to each other in a first direction and a second portion disposed at a boundary of transmissive areas which are adjacent to each other in a second direction, and at least one of the first portion and the second portion overlaps the signal line.

16. The display device of claim 11, wherein the touch electrode includes an opening overlapping the pixel and has a mesh form.

17. The display device of claim 11, wherein the signal line is a data line transferring a data signal or a gate line transferring a gate signal.

* * * * *